United States Patent [19]
Sakamoto

[11] Patent Number: 5,840,603
[45] Date of Patent: Nov. 24, 1998

[54] METHOD FOR FABRICATIONG BICMOS INTEGRATED CIRCUIT

[75] Inventor: Kayoko Sakamoto, Tokyo, Japan

[73] Assignee: NEC Corporation, Tokyo, Japan

[21] Appl. No.: 915,405

[22] Filed: Aug. 20, 1997

[30] Foreign Application Priority Data

Aug. 22, 1996 [JP] Japan ................................. 8-220893

[51] Int. Cl.$^6$ ............................................. H01L 21/8238
[52] U.S. Cl. ........................ 438/202; 438/303; 438/307; 438/370; 438/371; 438/373; 257/370
[58] Field of Search .................................... 438/202, 303, 438/306, 307, 371, 370, 373; 257/370

[56] References Cited

U.S. PATENT DOCUMENTS

| | | | |
|---|---|---|---|
| 5,116,770 | 5/1992 | Kameyama et al. | 437/31 |
| 5,216,271 | 6/1993 | Takagi et al. | 257/370 |
| 5,288,652 | 2/1994 | Wang et al. | 437/31 |
| 5,302,534 | 4/1994 | Monk et al. | 437/31 |
| 5,439,833 | 8/1995 | Hebert et al. | 437/31 |
| 5,643,810 | 7/1997 | Jang | 437/31 |
| 5,665,615 | 9/1997 | Anmo | 438/202 |
| 5,702,959 | 12/1997 | Hutter et al. | 437/31 |

Primary Examiner—John Niebling
Assistant Examiner—Long Pham

[57] ABSTRACT

A first photoresist layer has opening portions in a region where an n-channel MOS transistor should be formed and in a region where a collector leading region should be formed. Then, phosphorous is implanted with taking the first photoresist layer as a mask. The first photoresist layer is then removed and a second photoresist layer is formed. The second photoresist layer has opening portions in a region where an emitter region should be formed and in the region where the collector leading region should be formed. Phosphorous is implanted with taking the second photoresist layer as a mask to form an n-type selective diffusion region in a region below the region where the emitter region should be formed and in the region where the collector leading region should be formed. Then, the second photoresist layer is removed. A polycrystalline silicon layer is formed over the entire surface and arsenic is implanted therein to make it n-type. Thereafter, heat treatment is performed to form an emitter region in the region where the emitter region should be formed and an n-type diffusion layer in the region where the collector leading region should be formed.

12 Claims, 9 Drawing Sheets

FIG. 6A (PRIOR ART)
FIG. 6B (PRIOR ART)
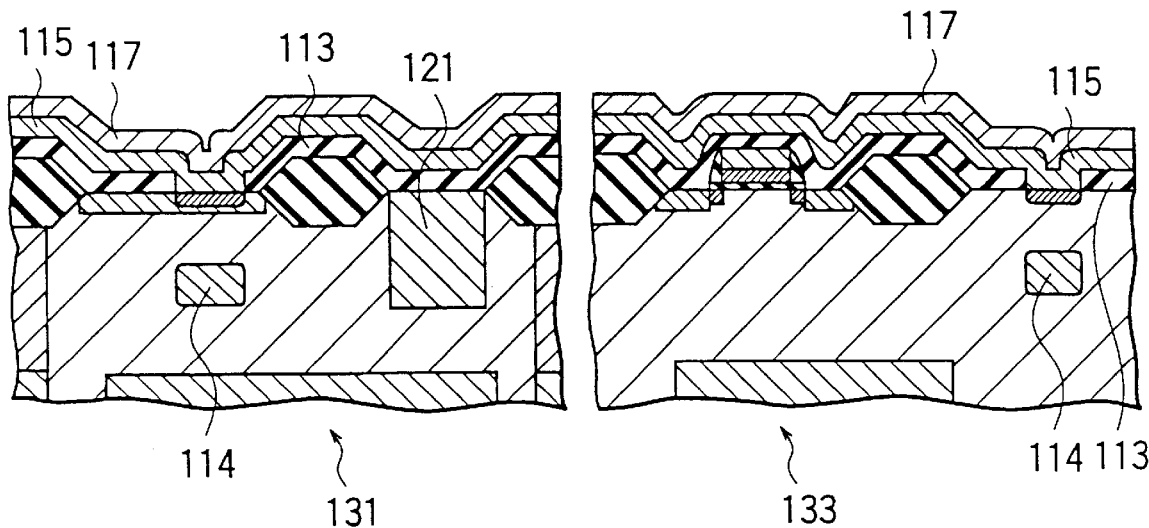
FIG. 7A (PRIOR ART)
FIG. 7B (PRIOR ART)
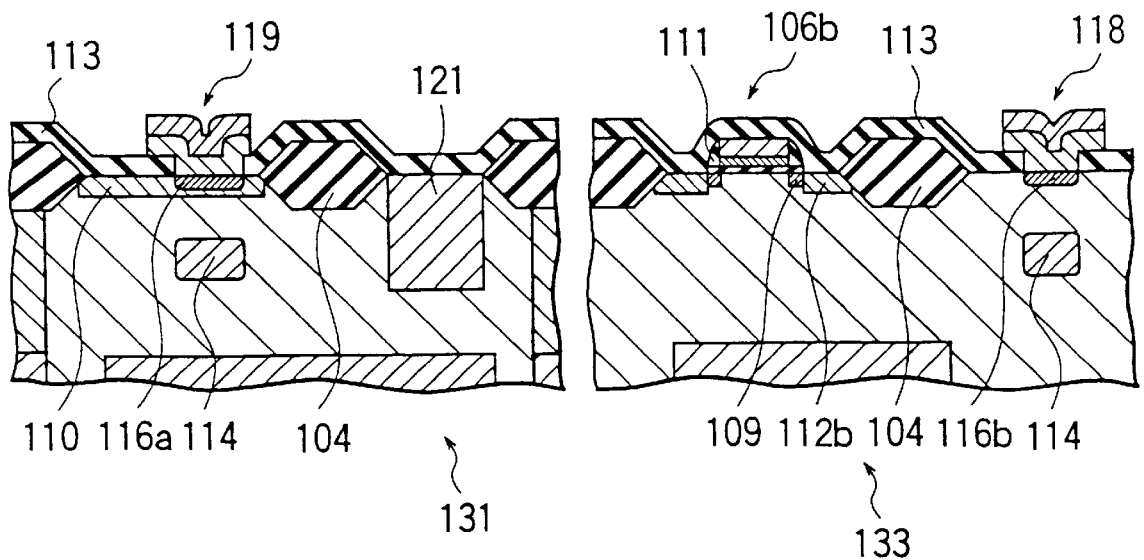

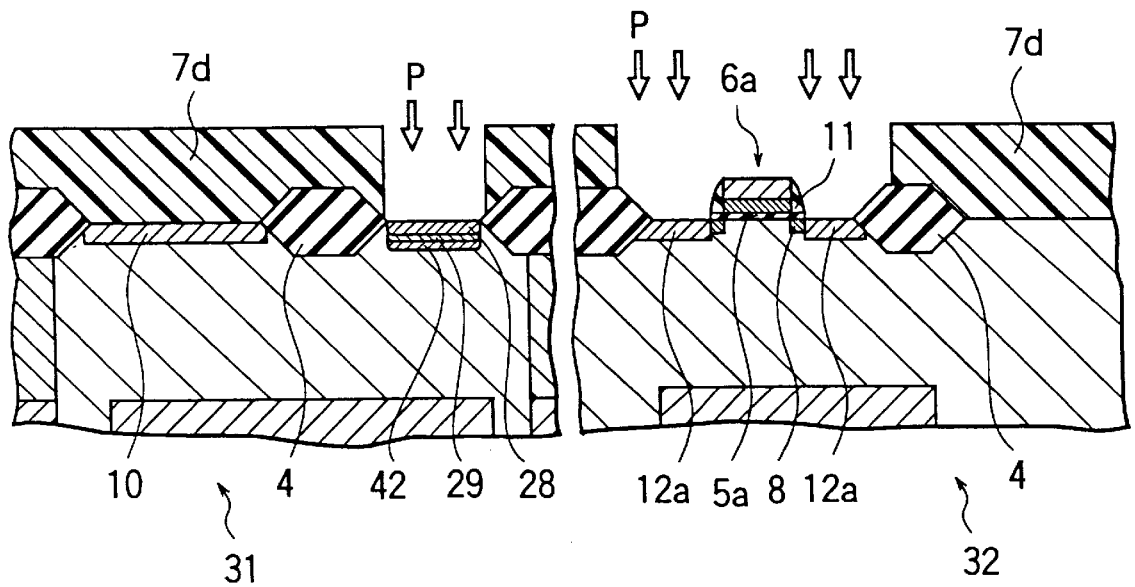
FIG. 11A
FIG. 11B
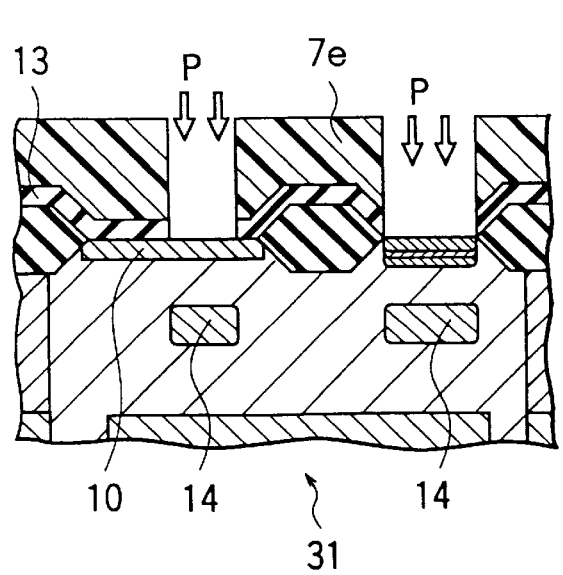
FIG. 12A
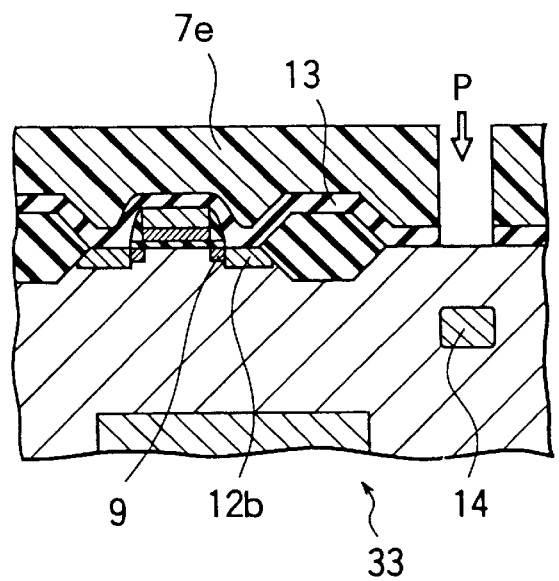
FIG. 12B

METHOD FOR FABRICATIONG BICMOS INTEGRATED CIRCUIT

BACKGROUND OF THE INVENTION

1. Field of the Invention

The present invention relates to a BiCMOS integrated circuit having a low resistance collector leading region and being fabricated through reduced process steps, and a fabrication process thereof.

2. Description of the Prior Art

In the recent years, with high operation speed of semiconductor devices, a BiCMOS integrated circuit, in which bipolar transistors are mounted and mixing with CMOS circuits has been used. Upon fabrication of such a BiCMOS integrated circuit, greater number of process steps is necessary than fabrication of a CMOS circuit. Therefore, production cost of the BiCMOS integrated circuit becomes high, and the BiCMOS integrated circuit is a relatively expensive product. In this connection, there is a strong demand for a fabrication process of a BiCMOS integrated circuit which can reduce number of process steps and thus can reduce production cost.

In order to facilitate clear understanding of the present invention, discussion will be given for a conventional fabrication process of a BiCMOS integrated circuit with reference to drawings. FIGS. 1A to 7 are sections showing a conventional fabrication process of a BiCMOS integrated circuit. A silicon substrate (not shown), on which a BiCMOS integrated circuit should be formed, is defined by a bipolar portion 131 where a bipolar transistor should be formed, an n-channel MOS portion 132 where an n-channel MOS should be formed and a p-channel MOS portion 133 where a p-channel MOS should be formed. FIG. 1A is a section of the bipolar portion, FIG. 1B is a section of the n-channel MOS portion and FIG. 1C is a section of the p-channel MOS portion, respectively showing a conventional fabrication process step of a BiCMOS integrated circuit. As shown in FIG. 1A, an n$^+$ buried layer 122 and a p$^+$ buried layer 123 are selectively formed on the silicon substrate in the bipolar portion 131. Then, an n-type epitaxial layer 101 is formed in the bipolar portion 131. As shown in FIG. 1B, a p$^+$ buried layer 124 and a p-type well 102 are formed in the n-channel MOS portion 132. At this time, a p-type well 102 is also formed on the p$^+$ buried layer 123 so as to be connected to each other in the bipolar portion 131 to island the bipolar transistor. Also, as shown in FIG. 1C, an n$^+$ buried layer 125 and an n-type well 103 are formed in the p-channel MOS portion 133. Then, an isolation region 104 is selectively formed in the bipolar portion 131, the n-channel MOS portion 132 and the p-channel MOS portion 133 by way of a LOCOS method. Next, gate insulation layers 105a and 105b are formed in regions surrounded by the isolation region 104 in the n-channel MOS portion 132 and the p-channel MOS portion 133. Then, a gate electrode 106a of a polycrystalline silicon layer 126a and a tungsten silicide layer 136a is selectively formed on the gate insulation layer 105a in the n-channel MOS portion 132. Also, a gate electrode 106b of a polycrystalline silicon layer 126b and a tungsten silicide layer 136b is selectively formed on the gate insulation layer 105b in the p-channel MOS portion 133.

Next, as shown in FIG. 1A, a photoresist layer 107a having an opening portion in a region where a collector leading region of the bipolar portion 131 should be formed is formed by way of a photolithographic method. Then, ion implantation of phosphorous is performed to form a collector leading region 121 having high phosphorous concentration with taking the photoresist layer 107a as a mask. Subsequently, the photoresist layer 107a is removed.

Then, as shown in FIG. 1B, a photoresist layer 107b having an opening portion in a region where an n-channel MOS should be formed is formed in the n-channel MOS portion 132 by way of a photolithographic method. Thereafter, ion implantation of phosphorous is performed to form a low concentration source-drain region 108 with taking the photoresist layer 107b as a mask. Then, the photoresist layer 107b is removed.

Next, as shown in FIG. 1C, a photoresist layer 107c having an opening portion in a region where the p-channel MOS should be formed is formed in the p-channel MOS portion 133 by way of a photolithographic method. Then, ion implantation of phosphorous is performed to form an n-type punch-through restricting region 109 for restricting punch-through phenomenon with taking the photoresist layer 107c as a mask. Thereafter, the photoresist layer 107c is removed.

FIG. 2 is a section of the bipolar portion 131 showing a process step following the process step shown in FIGS. 1A to 1C. After removing the photoresist layer 107c, a photoresist layer 107d having an opening portion in a region where a base region of the bipolar portion 131 should be formed is formed by way of a photolithographic method. Then, ion implantation of phosphorous is performed to form an intrinsic base region 110 with taking the photoresist layer 107d as a mask. Thereafter, the photoresist layer 107d is removed.

FIG. 3 is a section of the n-channel MOS portion showing a process step following the process step shown in FIG. 2. After removal of the photoresist layer 107d, a silicon oxide layer is deposited and etched back to form a side wall 111 on the side surface of the gate electrodes 106a and 106b. Subsequently, a photoresist layer 107e having an opening portion in a region where the n-channel MOS should be formed is formed by way of a photolithographic method. Then, ion implantation of phosphorous is performed to form a high concentration source-drain region 112a with taking the photoresist layer 107e as a mask. Thereafter, the photoresist layer 107e is removed. While not illustrated, in the p-channel MOS portion 133, ion implantation of boron is performed to form a source-drain region 112b. Simultaneously, ion implantation of boron is also performed in the intrinsic base region 110 in the bipolar portion 131.

FIG. 4A is a section of the bipolar portion 131 and FIG. 4B is a section of the p-channel MOS portion 133, respectively showing a process step following the process step shown in FIG. 3. After formation of the source-drain region 112b, an interlayer insulation layer 113 is deposited over the entire surface. Then, a photoresist layer 107f having an opening portion in a region where an emitter region of the bipolar portion 131 should be formed and an opening portion in a region where a high concentration n-type diffusion layer for a grounding wiring should be formed in the p-channel MOS portion 133 is formed on the interlayer insulation layer 113 by way of a photolithographic method. Thereafter, patterning of the interlayer insulation layer 113 is performed with taking the photoresist layer 107f as a mask. Subsequently, ion implantation of phosphorous is performed to form a high concentration n-type selective diffusion region 114 right below the region where the emitter region should be formed and right below the region where the high concentration n-type diffusion layer should be formed. Thereafter, the photoresist layer 107f is removed.

FIG. 5A is a section of the bipolar portion 131 and FIG. 5B is a section of the p-channel MOS portion 131, respectively showing a process step following the process step shown in FIGS. 4A and 4B. After removal of the photoresist layer 107f, a polycrystalline silicon layer is deposited over the entire surface. Also, ion implantation of arsenic is performed for the entire surface to form a high concentration n-type polycrystalline silicon layer 115. Also, by performing heat treatment, an emitter region 116a and a high concentration n-type diffusion layer 116b are formed.

FIG. 6A is a section of a bipolar portion 131 and FIG. 6B is a section of the p-channel MOS portion 133, respectively showing a process step following the process step shown in FIGS. 5A and 5B. After the heat treatment, a tungsten silicide (WSi) layer 117 is deposited.

FIG. 7A is a section of the bipolar portion 131 and FIG. 7B is a section of the p-channel MOS portion 133, respectively showing a process step following the step shown in FIGS. 6A and 6B. After deposition of the tungsten silicide layer 117, the high concentration n-type polycrystalline silicon layer 115 and the tungsten silicide layer 117 are selectively patterned to form a grounding wiring 118 on the high concentration n-type diffusion layer 116b and an emitter electrode 119 on the emitter region 116a.

In the foregoing conventional fabrication process of a BiCMOS integrated circuit, independent process steps of performing photolithography, performing ion implantation, and removing a photoresist layer have been required for forming the collector leading region 121. Therefore, a large number of process steps have to be done. Furthermore, since the collector leading region 121 is formed by only a one time ion implantation, the distribution of impurity becomes is substantially a Gaussian distribution. Therefore, a region locally having high resistance can be present in the collector leading region 121.

SUMMARY OF THE INVENTION

It is an object of the present invention to provide a BiCMOS integrated circuit having a collector leading region which has a uniform impurity distribution and can be fabricated through less process steps than required by the prior art, and a fabrication process thereof.

A fabrication process of a BiCMOS integrated circuit, according to the present invention, has a step of forming a first photoresist layer. The first photoresist has opening portions in a region where an n-channel MOS transistor should be formed, and in a region where a collector leading region of an npn-type bipolar transistor should be formed. Then, only a first n-type impurity is implanted using the first photoresist layer as a mask. Thereafter, the first photoresist layer is removed. Next, a second photoresist layer is formed. The second photoresist layer has opening portions in a region where an emitter region of the npn-type bipolar transistor should be formed, and in a region where the collector leading region should be formed. A second n-type impurity is then implanted using the second photoresist layer as a mask. By implantation of the second n-type impurity, an n-type selective diffusion region is formed in a region below the region where the emitter region will be formed and in the region where the collector leading region will be formed.

On the other hand, before forming the first photoresist layer, a third photoresist layer having an opening portions in the region where the n-channel MOS transistor should be formed, and in the region where the collector leading region should be formed may be formed. Next, only a third n-type impurity of lower concentration than that of the first n-type impurity is implanted with taking the third photoresist layer as a mask. Then, the third photoresist layer is removed.

Also, between the steps of removing the third photoresist layer and forming the first photoresist layer, a fourth photoresist layer having opening portions in a region where a p-channel MOS transistor should be formed, and in the region where the collector leading region should be formed may be formed. Thereafter, only a fourth n-type impurity is implanted with taking the fourth photoresist layer as a mask. Then, the fourth photoresist layer is removed.

Furthermore, after the step of implanting the second n-type impurity, the second photoresist layer may be removed. Then, a polycrystalline silicon layer is formed over the entire surface, and a fifth n-type impurity is implanted over the entire surface for forming an n-type polycrystalline silicon layer over the entire surface. Next, heat treatment is performed for forming an emitter region in the region where the emitter region should be formed, and an n-type diffusion layer in the region where the collector leading region should be formed.

It should be noted that the step of implanting the first impurity may have a step of performing ion implantation of phosphorous with injection energy of 100 (keV) and dose amount of $1\times10^{15}$ to $1\times10^{16}$ (atoms/cm$^2$).

On the other hand, the step of implanting the second impurity may have a step of performing ion implantation of phosphorous with injection energy of 300 (keV) and dose amount of $1\times10^{12}$ to $1\times10^{13}$ (atoms/cm$^2$).

Furthermore, the step of implanting the third impurity may have a step of performing ion implantation of phosphorous with injection energy of 40 (keV) and dose amount of $1\times10^{13}$ to $1\times10^{14}$ (atoms/cm$^2$).

The step of implanting the fourth impurity may have a step of performing ion implantation of phosphorous with injection energy of 80 (keV) and dose amount of $1\times10^{13}$ to $1\times10^{14}$ (atoms/cm$^2$).

Also, the step of implanting the fifth impurity may have a step of performing ion implantation of arsenic with injection energy of 30 (keV) and dose amount of $1\times10^{16}$ to $1\times10^{17}$ (atoms/cm$^2$).

According to the present invention, upon ion implantation of an n-type impurity for forming the elements except for the collector leading region, ion implantation of the n-type impurity is performed in the region where the collector leading region should be formed. Therefore, independent steps of photolithography, of ion implantation and of removing the photoresist layer are unnecessary to reduce number of process steps. On the other hand, the collector leading region can be formed through a plurality of times of ion implantation with different injection energy, resistance from the shallow region to deep region can be reduced in the collector leading region.

BRIEF DESCRIPTION OF THE DRAWINGS

The present invention will be understood more fully from the detailed description given hereinafter and from the accompanying drawings of the preferred embodiment of the present invention, which, however, should not be taken to limit the invention, but are for explanation and understanding only.

In the drawings:

FIG. 6A is a section of the bipolar portion showing a process step following the process step shown in FIGS. 5A and 5B;

FIG. 6B is a section of the p-channel MOS portion showing a process step following the process step shown in FIGS. 5A and 5B;

FIG. 7A is a section of the bipolar portion showing a process step following the process step shown in FIGS. 6A and 6B;

FIG. 7B is a section of the p-channel MOS portion showing a process step following the process step shown in FIGS. 6A and 6B;

FIG. 11A is a section of the bipolar portion showing a process step following the process step shown in FIG. 10;

FIG. 11B is a section of the n-channel MOS portion showing a process step following the process step shown in FIG. 10;

FIG. 12A is a section of the bipolar portion showing a process step following the process step shown in FIGS. 11A and 11B;

FIG. 12B is a section of the p-channel MOS portion showing a process step following the step shown in FIGS. 11A and 11B;

DESCRIPTION OF THE PREFERRED EMBODIMENT

Figure 1A:
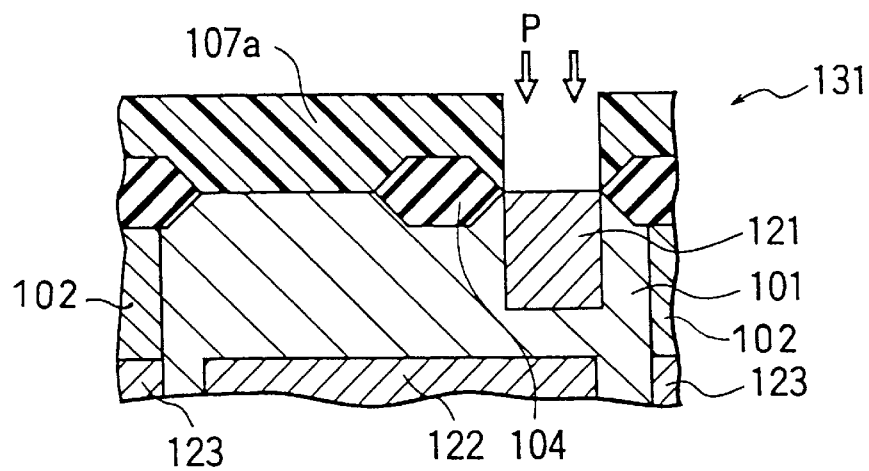
FIG. 1A is a section of a bipolar portion showing a conventional fabrication process step of a BiCMOS integrated circuit.
Figure 1B:
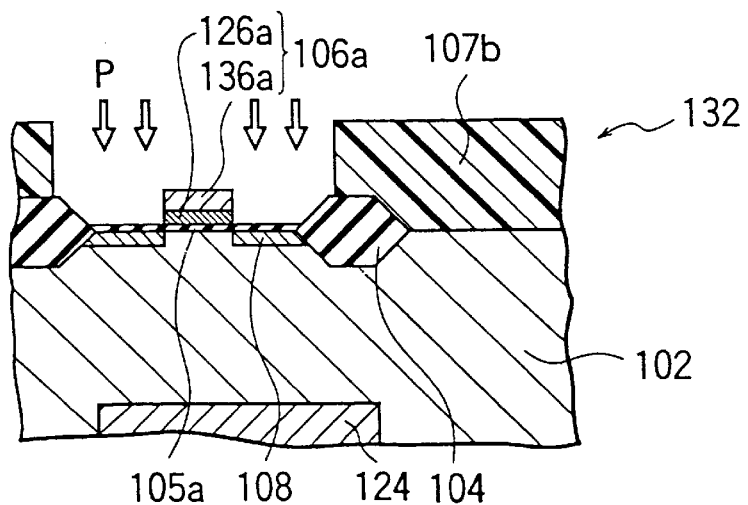
FIG. 1B is a section of an n-channel MOS portion showing a conventional fabrication process step of a BiCMOS integrated circuit.
Figure 1C:
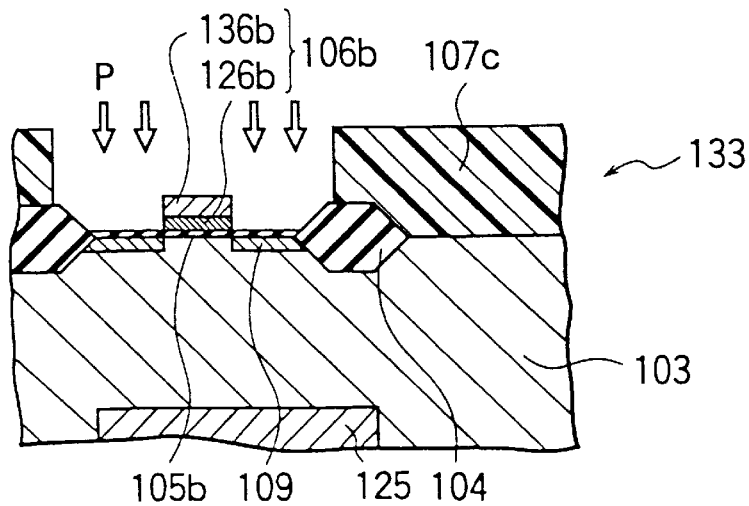
FIG. 1C is a section of a p-channel MOS portion showing a conventional fabrication process step of a BiCMOS integrated circuit.
Figure 2:
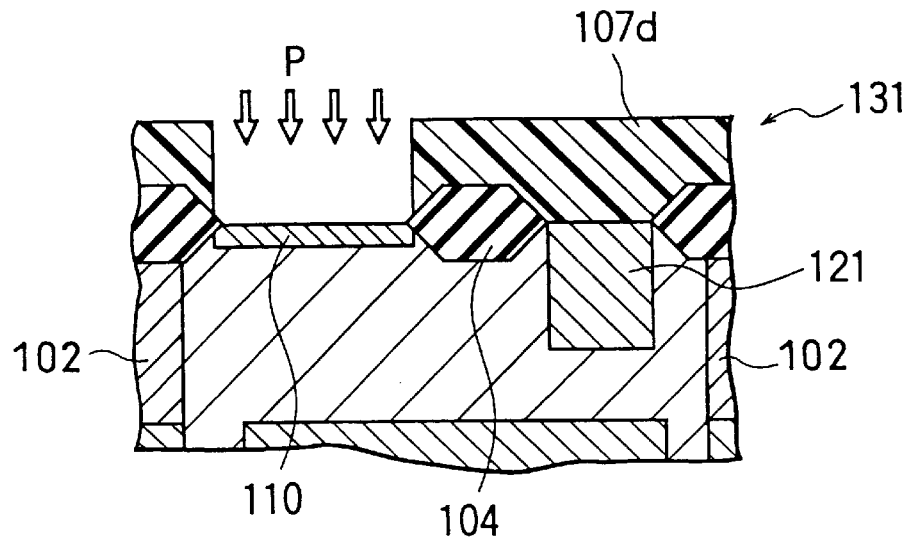
FIG. 2 is a section of the bipolar portion showing a process step following the process step shown in FIGS. 1A to 1C.
Figure 3:
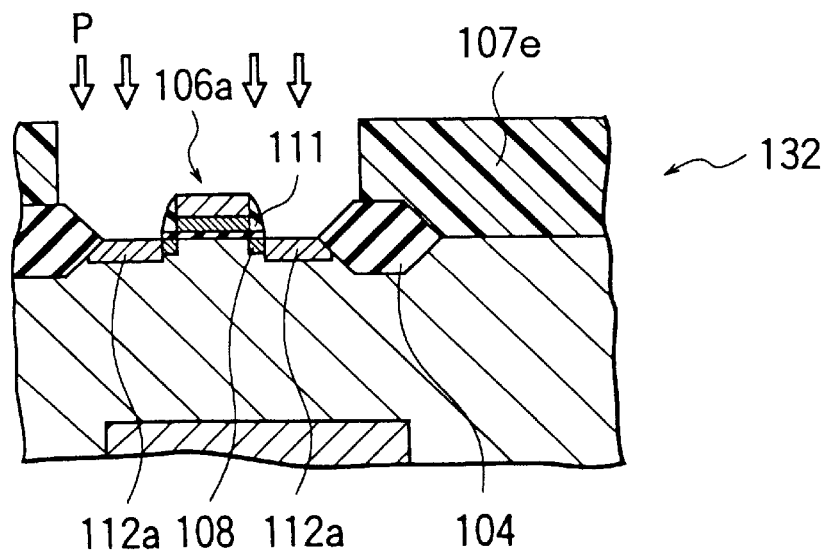
FIG. 3 is a section of the n-channel MOS portion showing a process step following the process step shown in FIG. 2.
Figure 4A:
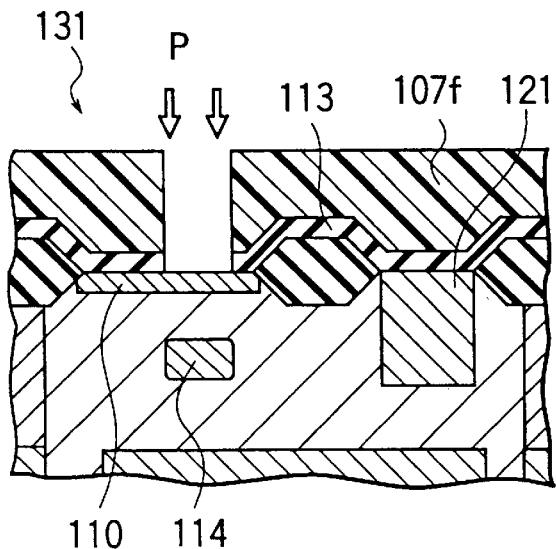
FIG. 4A is a section of the bipolar portion showing a process step following the process step shown in FIG. 3.
Figure 4B:
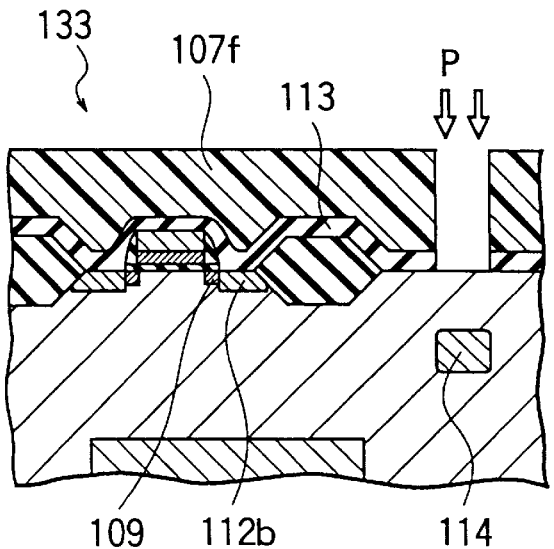
FIG. 4B is a section of the p-channel MOS portion showing a process step following the process step shown in FIG. 3.
Figure 5A:
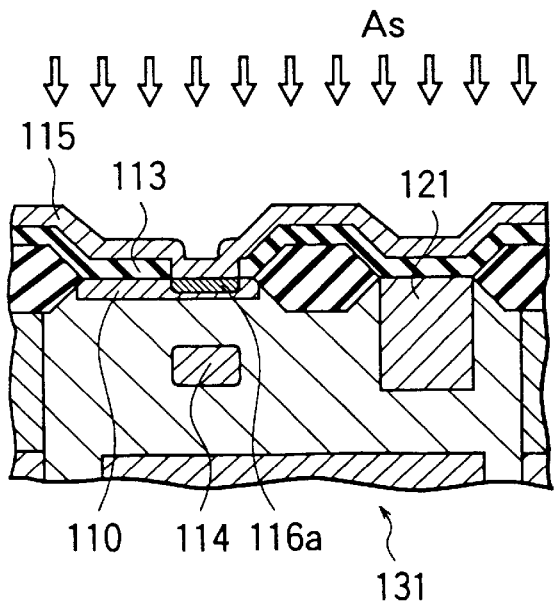
FIG. 5A is a section of the bipolar portion showing a process step following the process step shown in FIGS. 4A and 4B.
Figure 5B:
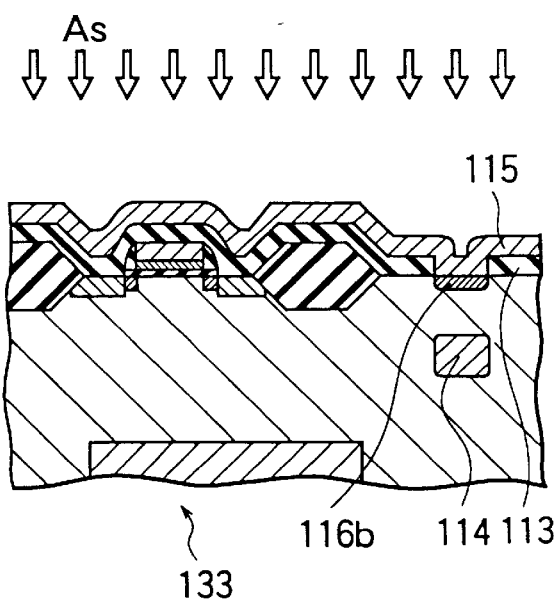
FIG. 5B is a section of the p-channel MOS portion showing a process step following the process step shown in FIGS. 4A and 4B.

The present invention will be discussed hereinafter in detailed terms of the preferred embodiment present invention with reference to the accompanying drawings. In the following description, numerous specific details are set forth in order to provide a thorough understanding of the present invention. It will be obvious, however, to those skilled in the art that the present invention may be practiced without these specific details. In other words, well-known structures are not shown in detail in order to avoid unnecessarily obscuring the present invention.

FIGS. 8 to 15 are sections showing the preferred embodiment of a fabrication process of a BiCMOS integrated circuit according to the present invention. A silicon substrate (not shown), on which a BiCMOS integrated circuit will be formed, is defined to be a bipolar portion 31 where a bipolar transistor should be formed, an n-channel MOS portion 32 where an n-channel MOS should be formed, and a p-channel MOS portion 33 where a p-channel MOS should be formed. FIG. 8A is a section of the bipolar portion 31, FIG. 8B is a section of the n-channel MOS portion 32, and FIG. 8C is a section of the p-channel MOS portion 33, each respectively showing a process step of the preferred embodiment of a fabrication process of a BiCMOS integrated circuit according to the present invention. First, as shown in FIG. 8A, an n$^+$ buried layer 22 and a p$^+$ buried layer 23 are selectively formed on the silicon substrate in the bipolar portion 31. Then, an n-type epitaxial layer 1 is formed in the bipolar portion 31. Also, as shown in FIG. 8B, a p$^+$ buried layer 24 and a p-type well 2 are formed in the n-channel MOS portion 32. At this time, a p-type well 2 is also formed on the p$^+$ buried layer 23 in FIG. 8A so as to be connected to each other in the bipolar portion 31 to isolate the bipolar transistor. As shown in FIG. 8C, an n$^+$ buried layer 25 and an n-type well 3 are formed in the p-channel MOS portion 33. An isolation region 4 is selectively formed in the bipolar portion 31, the n-channel MOS portion 32 and the p-channel MOS portion 33 by way of a LOCOS method. Next, gate insulation layers 5a and 5b are formed in regions surrounded by the isolation region 4 in the n-channel MOS portion 3 the p-channel MOS portion 33. Then, a gate electrode 6a of a polycrystalline silicon layer 26a and a tungsten silicide layer 46a is formed on the gate insulation layer 5a in the n-channel MOS portion 32. Also, a gate electrode 6b of a polycrystalline silicon layer 26b and tungsten silicide layer 46b is selectively formed on the gate insulation layer 5b in the p-channel MOS portion 33.

Figure 8A:
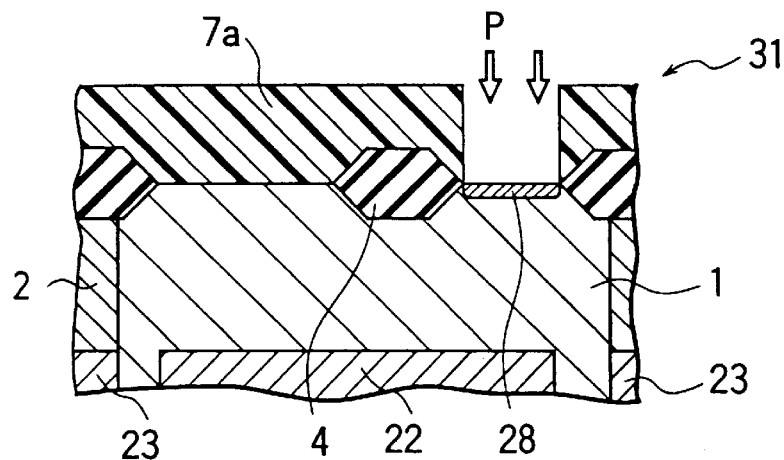
FIG. 8A is a section of a bipolar portion showing a process step of the preferred embodiment of a fabrication process of a BiCMOS integrated circuit according to the present invention.
Figure 8B:
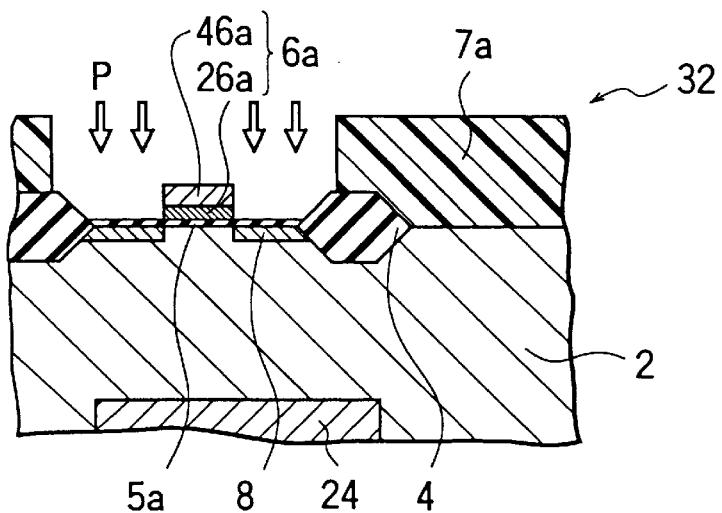
FIG. 8B is a section of an n-channel MOS portion showing a process step of the preferred embodiment of a fabrication process of a BiCMOS integrated circuit according to the present invention.
Figure 8C:
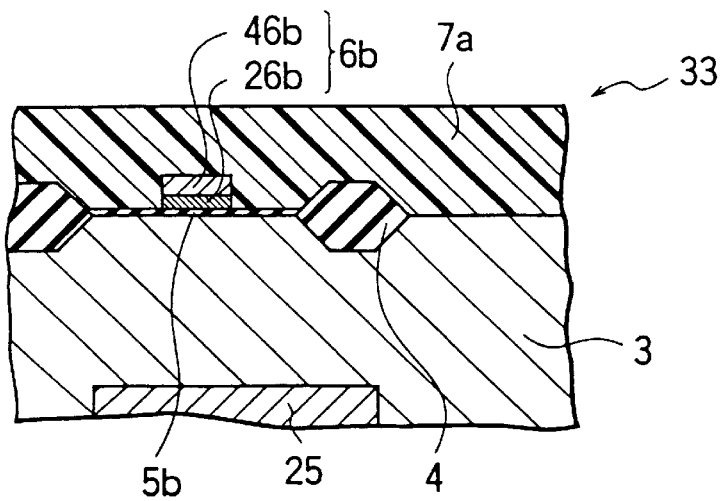
FIG. 8C is a section of a p-channel MOS portion showing a process step of the preferred embodiment of a fabrication process of a BiCMOS integrated circuit according to the present invention.

Next, as shown in FIGS. 8A to 8C, a photoresist 7a having opening portions in a region where a collector leading region of the bipolar portion 31 should be formed and in a region where an n-channel MOS in the n-channel MOS portion 32 should be formed is formed by way of a photolithographic method. Then, ion implantation of phosphorous is performed under a condition of injection energy of 40 (keV) and dose amount of $1 \times 10^{13}$ to $1 \times 10^{14}$ (atoms/cm$^2$) to form a low concentration source-drain region 8 in the n-channel MOS portion 32 and to simultaneously form a low concentration n-type diffusion layer 28 in the bipolar MOS portion 31 with taking the photoresist 7a as a mask. Subsequently, the photoresist layer 7a is removed.

Figures 9A, 9B:
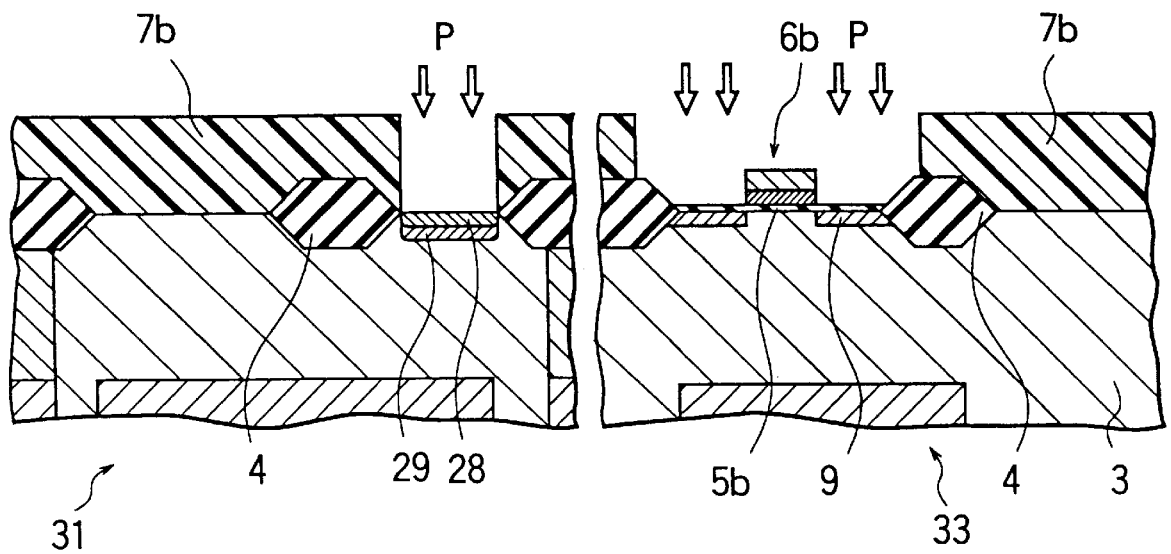
FIG. 9A is a section of the bipolar portion showing a process step following the process step shown in FIGS. 8A to 8C.
FIG. 9B is a section of the p-channel MOS portion showing a process step following the process step shown in FIGS. 8A to 8C.

FIG. 9A is a section of the bipolar portion 31 and FIG. 9B is a section of the p-channel MOS portion 33, respectively showing a process step following the process step shown in FIGS. 8A to 8C. After removing the photoresist layer 7a, a photoresist layer 7b having opening portions in the region where the collector leading region of the bipolar portion 31 should be formed and in a region where the p-channel MOS 33 should be formed is formed by way of photolithographic method. Then, ion implantation of phosphorous is performed under a condition of injection energy of 80 (keV) and dose amount of $1 \times 10^{13}$ to $1 \times 10^{14}$ (atoms/cm$^2$) to form an n-type punch-through restricting region 9 for restricting punch-through phenomenon in the p-channel MOS portion 33 and to simultaneously form an n-type diffusion layer 29 below the low concentration n-type diffusion layer 28 with taking the photoresist layer 7b as a mask. Thereafter, the photoresist layer 7b is removed.

Figure 10:
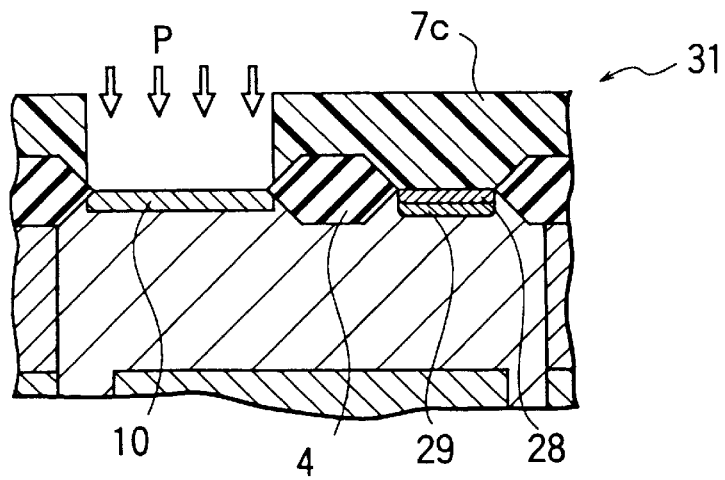
FIG. 10 is a section of the bipolar portion showing a process step following the process step shown in FIGS. 9A and 9B.

FIG. 10 is a section of the bipolar portion 31 showing a process step following the process step shown in FIGS. 9A and 9B. After removing the photoresist layer 7b, a photoresist layer 7c having an opening portion in a region where a base region of the bipolar portion 31 should be formed by way of a photolithographic method. Then, ion implantation of boron is performed to form an intrinsic base region 10 with taking the photoresist layer 7c as a mask. Thereafter, the photoresist layer 7c is removed.

FIG. 11A is a section of the bipolar portion 31 and FIG. 11B is a section of the n-channel MOS portion 32, respectively showing a process step following the process step shown in FIG. 10. After removing the photoresist layer 7c, a silicon oxide layer is deposited and etched back to form a side wall 11 on the side surface of the gate electrodes 6a and 6b. Then, a photoresist layer 7d having opening portions in the region where the collector leading region of the bipolar portion 31 should be formed and in the region where the n-channel MOS should be formed in the n-channel MOS portion 32 is formed by way of a photolithographic method. Then, ion implantation of phosphorous is performed under a condition of injection energy of 100 (keV) and dose amount of $1 \times 10^{15}$ to $1 \times 10^{16}$ (atoms/cm$^2$) to form a high concentration source-diffusion layer 12a in the n-type channel MOS portion 32 and to simultaneously form a high concentration n-type diffusion layer 42 below the n-type diffusion layer 29 with taking the photoresist layer 7d as a mask. Thereafter, the photoresist layer 7d is removed. Also, while not illustrated in the drawings, in the p-channel MOS portion 33, ion implantation of boron is performed to form a source-drain region 12b. Simultaneously therewith, ion implantation of boron is performed in the intrinsic base region 10 in the bipolar portion 31.

FIG. 12A is a section of the bipolar portion 31 and FIG. 12B is a section of the p-channel MOS portion 33, respectively showing a process step following the process step shown in FIGS. 11A and 11B. After formation of the source-drain region 12b, an interlayer insulation layer 13 of silicon oxide is deposited in a thickness of 200 nm over the entire surface by way of a CVD method. Furthermore, a photoresist layer 7e having opening portions in a region where an emitter region of the bipolar portion 31 should be formed, in a region where the collector leading region should be formed and in a region where a high concentration diffusion layer for a grounding wiring in the p-channel MOS portion 33 should be formed is formed on the interlayer insulation by way of a photolithographic method. Then, ion implantation of phosphorous is performed under a condition of injection energy of 300 (keV) and dose amount of $1 \times 10^{12}$ to $1 \times 10^{13}$ (atoms/cm$^2$) to form a high concentration n-type selective diffusion region 14 in the region where the collector leading region should be formed, right below the region where the emitter region should be formed and right below the region where a high concentration n-type diffusion layer for a grounding wiring should be formed with taking the photoresist layer 7e as a mask. Thereafter, the photoresist layer 7e is removed.

Figure 13A:
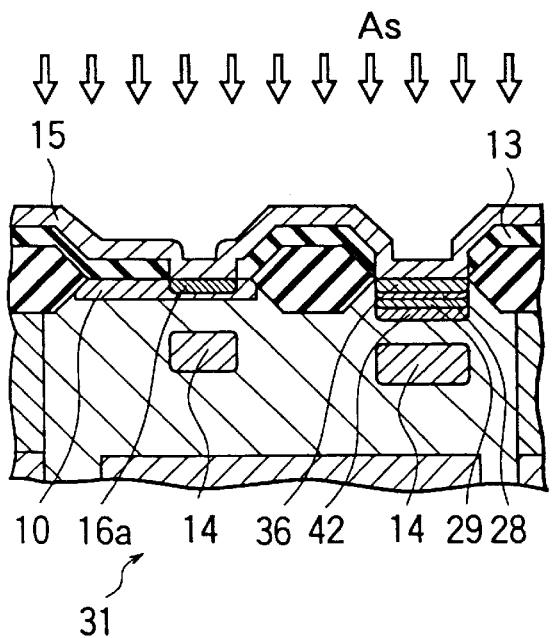
FIG. 13A is a section of the bipolar portion showing a process step following the process step shown in FIGS. 12A and 12B.
Figure 13B:
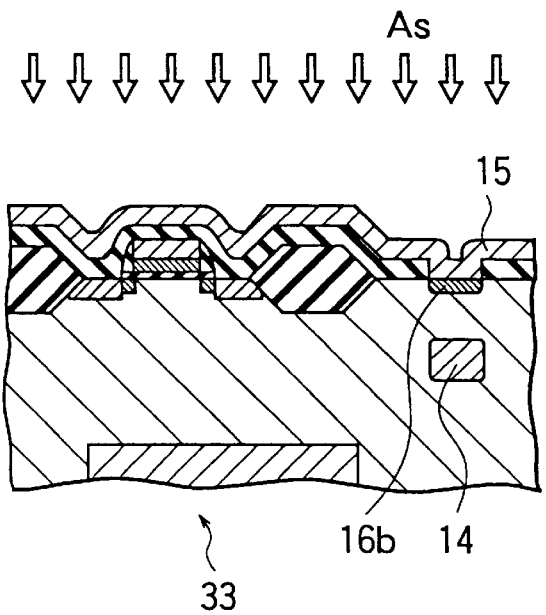
FIG. 13B is a section of the p-channel MOS portion showing a process step following the process step shown in FIGS. 12A and 12B.

FIG. 13A is a section of the bipolar portion 31 and FIG. 13B is a section of the p-channel MOS portion 33, respectively showing a process step following the process step shown in FIGS. 12A and 12B. After removing the photoresist layer 7e, polycrystalline silicon is deposited over the entire surface in a thickness of 100 nm by way of a CVD method. Then, ion implantation of arsenic is performed under a condition of injection energy of 30 (keV) and dose amount of $1 \times 10^{16}$ to $1 \times 10^{17}$ (atoms/cm$^2$) to form a high concentration n-type polycrystalline silicon layer 15. Then, by performing heat treatment, an emitter region 16a and a high concentration n-type diffusion layer 16b are formed, and a high concentration n-type diffusion layer 36 is formed within the low concentration n-type diffusion layer 28 simultaneously. Therefore, the collector leading region is formed of the n-type diffusion layer 14 and the n-type diffusion layers 28, 29, 42 and 36.

Figure 14A:
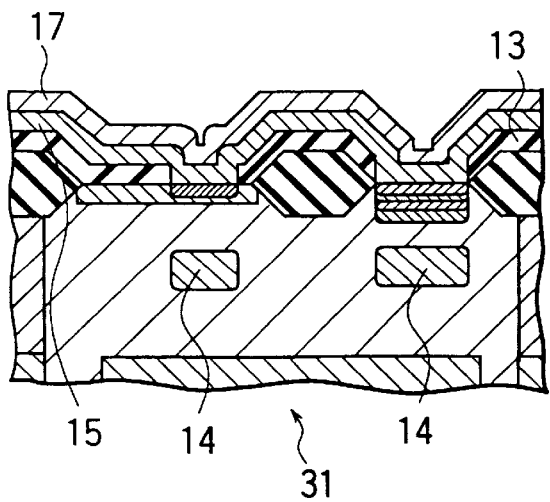
FIG. 14A is a section of the bipolar portion showing a process step following the process step shown in FIGS. 13A and 13B.
Figure 14B:
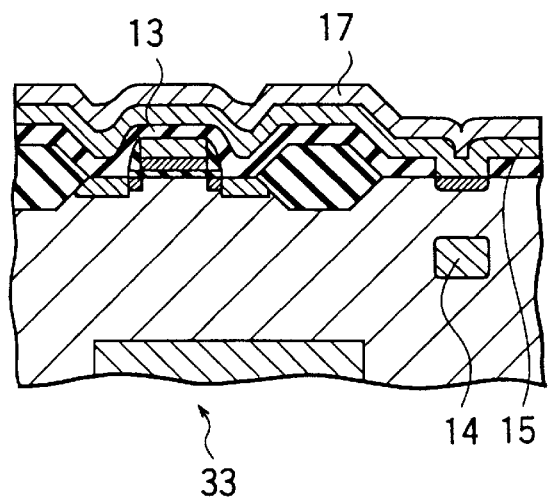
FIG. 14B is a section of the p-channel MOS portion showing a process step following the step shown in FIGS. 13A and 13B.

FIG. 14A is a section of the bipolar portion 31 and FIG. 14B is a section of the p-channel MOS portion 33, respectively showing a process step following the process step shown in FIGS. 13A and 13B. After the heat treatment, a tungsten silicide (WSi) layer 17 is deposited over the entire surface in a thickness of 110 nm by way of sputtering.

Figures 15A, 15B:
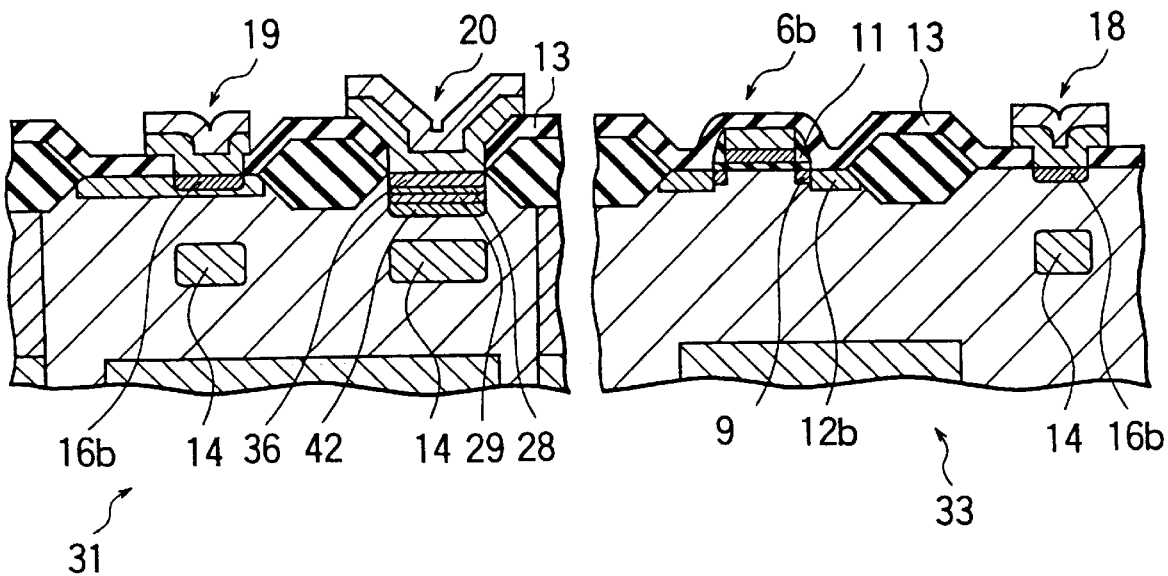
FIG. 15A is a section of the bipolar portion showing a process step following the process step shown in FIGS. 14A and 14B.
FIG. 15B is a section of the p-channel MOS portion showing a process step following the process step shown in FIGS. 14A and 14B.

FIG. 15A is a section of the bipolar portion 31 and FIG. 15B is a section of the p-channel MOS portion 33, respectively showing a process step following the process step shown in FIGS. 14A and 14B. After deposition of the tungsten silicide layer 17, the high concentration n-type polycrystalline silicon layer 15 and the tungsten silicide layer 17 are selectively patterned to form a grounding wiring 18 on the high concentration n-type diffusion layer 16b, an emitter electrode 19 on the emitter region 16a, and a collector electrode 20 on the collector leading region.

Subsequently, while not illustrated on the drawings, an interlayer insulation layer is formed over the entire surface, and contact holes are selectively formed through the interlayer insulation layer. Thereafter, by forming aluminum wiring, a BiCMOS integrated circuit is completed.

In the shown embodiment, ion implantation of n-type impurity is performed for the region where the collector leading region should be formed simultaneously with all of the process steps performing ion implantation of n-type impurity. Therefore, independent process steps of performing photolithography, of performing ion implantation and of removing a photoresist layer used for ion implantation for forming only the collector leading region are unnecessary.

Thus, number of process steps can be reduced. Furthermore, since ion implantation of n-type impurity is performed for a plurality of times with different injection energy, a resistance of the collector can be lowered in the extent of 50Ω.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

For instance, an impurity to be used in ion implantation is not limited to phosphorous, arsenic and boron.

Also, the present invention is applicable for a BiCMOS integrated circuit to be formed with a substrate which does not have a buried layer or an epitaxial layer.

It should be noted that, in the present invention, when an n-type impurity and a p-type impurity are doped using the same mask, doping of the n-type impurity for the region where the collector leading region should be formed is not performed. For instance, in the process step shown in FIGS. 8A to 8C, in case that a p-type punch-through restricting region for restricting punch-through phenomenon is also formed in the n-channel MOS portion with taking the photoresist layer 7a as a mask, the n-type impurity will not be doped for the region where the collector leading region should be formed when the low concentration source-drain region 8 is formed. Similarly, in the process step shown in FIGS. 9A and 9B, in case that the low concentration source-drain region 12b is also formed in the p-channel MOS portion with taking the photoresist layer 7b as a mask, the n-type impurity will not be doped for the region where the collector leading region should be formed when the n-type punch-through restricting region 9 is formed.

Accordingly, it is not necessary to form regions having the same concentration distribution of impurity as that of the low concentration source-drain region and/or that of the n-type punch-through restricting region 9, in the collector leading region.

What is claimed is:

1. A fabrication process of a BiCMOS integrated circuit comprising the steps of:

forming a first photoresist layer on a semiconductor substrate, said first photoresist layer having first opening portions in a region where an n-channel MOS transistor is formed in said semiconductor substrate, and in a region where a collector leading region of an npn-type bipolar transistor is formed in said semiconductor substrate;

implanting a first n-type impurity with said first photoresist layer as a mask;

removing said first photoresist layer;

forming a second photoresist layer on said semiconductor substrate, said second photoresist layer having second opening portions in a region where an emitter region of said npn-type bipolar transistor is formed, and in the region where said collector leading region is forming; and implanting a second n-type impurity with said second photoresist layer as a mask for forming an n-type selective diffusion region in a region below a region where said emitter region is formed and in the region where said collector leading region is formed.

2. A fabrication process of a BiCMOS integrated circuit as set forth in claim 1, which further comprises the steps of: after the step of implanting said second n-type impurity, removing said second photoresist layer;

forming a polycrystalline silicon layer over the entire surface;

implanting a third n-type impurity over the entire surface for forming an n-type polycrystalline silicon layer over the entire surface; and performing heat treatment for forming an emitter region in the region where said emitter region is formed, and an n-type diffusion layer in the region where said collector leading region is formed.

3. A fabrication process of a BiCMOS integrated circuit as set forth in claim 1, which further comprises the steps of: before the step of forming said first photoresist layer, forming a third photoresist layer on said semiconductor substrate, said third photoresist layer having third opening portions in the region where said n-channel MOS transistor is formed, and in the region where said collector leading region is formed, implanting a third n-type impurity of lower concentration than that of said first n-type impurity with said third photoresist layer as a mask; and removing said third photoresist layer.

4. A fabrication process of a BiCMOS integrated circuit as set forth in claim 1, which further comprises the steps of: before the step of forming said first photoresist layer, forming a third photoresist layer on said semiconductor substrate, said third photoresist layer having third opening portions in a region where a p-channel MOS transistor is formed, and in the region where said collector leading region is formed;

implanting a third n-type impurity with said third photoresist layer as a mask; and removing said third photoresist layer.

5. A fabrication process of a BiCMOS integrated circuit as set forth in claim 3, which further comprises the steps of: between the steps of removing said third photoresist layer and forming said first photoresist layer, forming a fourth photoresist layer on said semiconductor substrate, said fourth photoresist layer having fourth opening portions in a region where a p-channel MOS transistor is formed in said semiconductor substrate, and in the region where said collector leading region is formed;

implanting a fourth n-type impurity with said fourth photoresist layer as a mask; and removing said fourth photoresist layer.

6. A fabrication process of a BiCMOS integrated circuit as set forth in claim 1, wherein the step of implanting said first impurity has a step of performing ion implantation of phosphorous with injection energy of 100 (keV) and dose amount of $1 \times 10^{15}$ to $1 \times 10^{16}$ (atoms/cm$^2$).

7. A fabrication process of a BiCMOS integrated circuit as set forth in claim 1, wherein the step of implanting said second impurity has a step of performing ion implantation of phosphorous with injection energy of 300 (keV) and dose amount of $1 \times 10^{12}$ to $1 \times 10^{13}$ (atoms/cm$^2$).

8. A fabrication process of a BiCMOS integrated circuit as set forth in claim 2, wherein the step of implanting said third impurity has a step of performing ion implantation of arsenic with injection energy of 30 (keV) and dose amount of $1 \times 10^{16}$ to $1 \times 10^{17}$ (atoms/cm$^2$).

9. A fabrication process of a BiCMOS integrated circuit as set forth in claim 3, wherein the step of implanting said third impurity has a step of performing ion implantation of phosphorous with injection energy of 40 (keV) and dose amount of $1\times10^{13}$ to $1\times10^{14}$ (atoms/cm$^2$).

10. A fabrication process of a BiCMOS integrated circuit as set forth in claim 4, wherein the step of implanting said third impurity has a step of performing ion implantation of phosphorous with injection energy of 80 (keV) and dose amount of $1\times10^{13}$ to $1\times10^{14}$ (atoms/cm$^2$).

11. A fabrication process of a BiCMOS integrated circuit as set forth in claim 5, which further comprising the steps of: after the step of implanting said second n-type impurity, removing said second photoresist layer;

forming a polycrystalline silicon layer over the entire surface;

implanting a fifth n-type impurity over the entire surface for forming an n-type polycrystalline silicon layer over the entire surface; and performing heat treatment for forming an emitter region in the region where said emitter region is formed and an n-type diffusion layer in the region where said collector leading region is formed.

12. A fabrication process of a BiCMOS integrated circuit as set forth in claim 11, wherein the step of implanting said fourth n-type impurity has a step of performing ion implantation of phosphorous with injection energy of 80 (keV) and dose amount of $1\times10^{13}$ to $1\times10^{14}$ (atoms/cm$^2$), and the step of implanting said fifth n-type impurity has a step of performing ion implantation of arsenic with injection energy of 30 (keV) and dose amount of $1\times10^{16}$ to $1\times10^{17}$ (atoms/cm$^2$).

* * * * *